United States Patent
Zeng et al.

(10) Patent No.: US 8,548,027 B2
(45) Date of Patent: Oct. 1, 2013

(54) MULTI-ARY ERROR-CORRECTING CODE TRANSMITTING AND RECEIVING APPARATUSE, DATA TRANSMISSION SYSTEM, AND RELEVANT METHOD

(75) Inventors: Yanxing Zeng, Shenzhen (CN); Raymond W. K. Leung, Shenzhen (CN); Ying Jin, Shenzhen (CN); Chao Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 334 days.

(21) Appl. No.: 12/771,757

(22) Filed: Apr. 30, 2010

(65) Prior Publication Data

US 2010/0220768 A1   Sep. 2, 2010

Related U.S. Application Data

(63) Continuation of application No. PCT/CN2008/072876, filed on Oct. 30, 2008.

(30) Foreign Application Priority Data

Nov. 2, 2007   (CN) .......................... 2007 1 0166505

(51) Int. Cl.
   *H04B 1/00* (2006.01)
(52) U.S. Cl.
   USPC ........... 375/141; 375/130; 375/131; 375/132; 375/133; 375/134; 375/135; 375/136; 375/153; 370/342; 370/335; 370/441; 370/320
(58) Field of Classification Search
   USPC ................. 375/141, 130, 131, 132, 133, 134, 375/135, 136, 153; 370/342, 335, 441, 320
   See application file for complete search history.

(56) References Cited

U.S. PATENT DOCUMENTS

| | | | |
|---|---|---|---|
| 2003/0064744 A1* | 4/2003 | Zhang et al. | 455/522 |
| 2005/0243951 A1* | 11/2005 | Wang | 375/340 |
| 2006/0039271 A1 | 2/2006 | Li et al. | |

(Continued)

FOREIGN PATENT DOCUMENTS

| | | | |
|---|---|---|---|
| CN | 1256033 A | 6/2000 | |
| CN | 1547339 A | 11/2004 | |

(Continued)

OTHER PUBLICATIONS

Sergio Benedetto, et al., "Unveiling Turbo Codes: Some Results on Parallel Concatenated Coding Schemes", IEEE Transactions on Information Theory, vol. 42, No. 2, Mar. 1996, p. 409-428.

Li Ping, et al., "Interleave-Division Multiple-Access", IEEE Transactions on Wireless Communications, vol. 5, No. 4, Apr. 2006, p. 938-947.

(Continued)

*Primary Examiner* — Zewdu Kassa (57) ABSTRACT

The embodiments of the present invention disclose an apparatus for transmitting multi-ary error-correcting codes, an apparatus for receiving multi-ary error-correcting codes, a data transmission system, and relevant methods to simplify operations. The apparatus for transmitting multi-ary error-correcting codes includes: a multi-ary channel encoder, adapted to perform multi-ary coding for source data frames of a user to obtain encoded sequences; a symbol mapper, adapted to perform symbol mapping for the encoded sequences to obtain symbol sequences; and a spreading and interleaving unit, adapted to spread and interleave the symbol sequences. Moreover, a corresponding apparatus for receiving multi-ary error-correcting codes, a data transmission system, and relevant methods are provided.

8 Claims, 7 Drawing Sheets

(56) References Cited

U.S. PATENT DOCUMENTS

| | | | |
|---|---|---|---|
| 2006/0159160 A1* | 7/2006 | Kim et al. | 375/148 |
| 2006/0193391 A1* | 8/2006 | Borran et al. | 375/260 |
| 2006/0251149 A1* | 11/2006 | Fujii | 375/146 |
| 2009/0122903 A1* | 5/2009 | Miyazaki et al. | 375/286 |
| 2010/0290561 A1* | 11/2010 | Ko et al. | 375/298 |

FOREIGN PATENT DOCUMENTS

| | | |
|---|---|---|
| CN | 1547409 A | 11/2004 |
| CN | 1744747 A | 3/2006 |
| EP | 1 775 840 A1 | 4/2007 |
| EP | 1 775 869 A1 | 4/2007 |
| WO | WO 01/43289 A1 | 6/2001 |
| WO | WO 2004/015890 A1 | 2/2004 |
| WO | WO 2007/037631 A1 | 4/2007 |

OTHER PUBLICATIONS

David Declercq, et al., "Decoding Algorithms for Nonbinary LDPC Codes Over GF(q)", IEEE Transactions on Communications, vol. 55, No. 4, Apr. 2007, p. 633-643.

Translation of Office Action dated Dec. 3, 2010 in connection with Chinese Patent Application No. 200710166505.5.

Written Opinion of the International Searching Authority dated Feb. 5, 2009 in connection with International Patent Application No. PCT/CN2008/072876.

International Search Report issued Feb. 5, 2009 in connection with PCT Application No. PCT/CN2008/072876 filed Oct. 10, 2008.

Partial translation of Office Action dated Jan. 31, 2012 in connection with Chinese Patent Application No. 200710166505.5.

\* cited by examiner

FIG. 1

(Prior Art)

FIG. 2

(Prior Art)

MULTI-ARY ERROR-CORRECTING CODE TRANSMITTING AND RECEIVING APPARATUSE, DATA TRANSMISSION SYSTEM, AND RELEVANT METHOD

CROSS-REFERENCE TO RELATED APPLICATIONS

This application is a continuation of International Application No. PCT/CN2008/072876, filed on Oct. 30, 2008, which claims priority to Chinese Patent Application No. 200710166505.5, filed on Nov. 2, 2007, both of which are hereby incorporated by reference in their entireties.

FIELD OF THE INVENTION

The present invention relates to the data encoding and decoding field, and in particular, to an apparatus for transmitting multi-ary error-correcting codes, an apparatus for receiving multi-ary error-correcting codes, a data transmission system, and relevant methods.

BACKGROUND

The existing communication system involves different methods of Multiple Access, for example, Code Division Multiple Access (CDMA) and Interleave Division Multiple Access (IDMA). The CDMA means that different users use different spread code sequences to transmit information, and the IDMA means that different users use different interleavers to transmit information.

In the CDMA technology, the Forward Error Correction (FEC) is concatenated with spreading operation on the transmitter side. From the perspective of the channel coding theory, the spreading operation does not obtain any coding gain, and the IDMA technology substitutes low bit rate FEC for the concatenation between the FEC and the spreading operation in the CDMA technology. Therefore, the coding gain can be maximized. In both theory and practice, it is proved that the IDMA technology provides higher spectrum utilization ratio compared with the CDMA technology.

In the prior art, the IDMA-based data transmission solution employs binary codes. For details, see FIG. 1 and FIG. 2.

Figure 1:
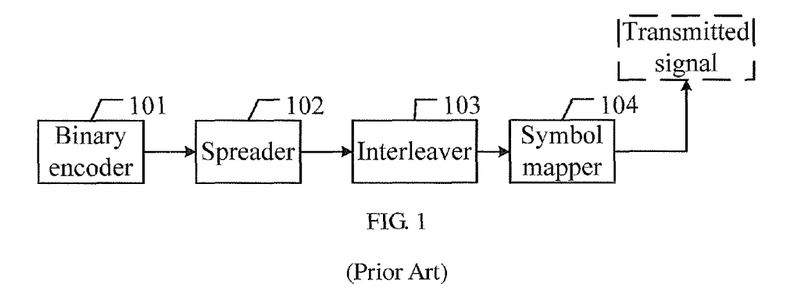
FIG. 1 shows an IDMA transmitter apparatus under high-order modulation in the prior art.

FIG. 1 shows an IDMA transmitter apparatus under high-order modulation in the prior art. The apparatus includes a binary encoder 101, a spreader 102, an interleaver 103, and a symbol mapper 104. The detailed process is as follows:

The user source data frame is processed by the binary encoder 101 into an encoded sequence, the encoded sequence is processed by the spreader 102 into a spreading sequence, the spreading sequence is processed by the interleaver 103 into an interleaved sequence, and the interleaved sequence is processed by the symbol mapper 104 into a symbol sequence, which is then sent out.

Figure 2:
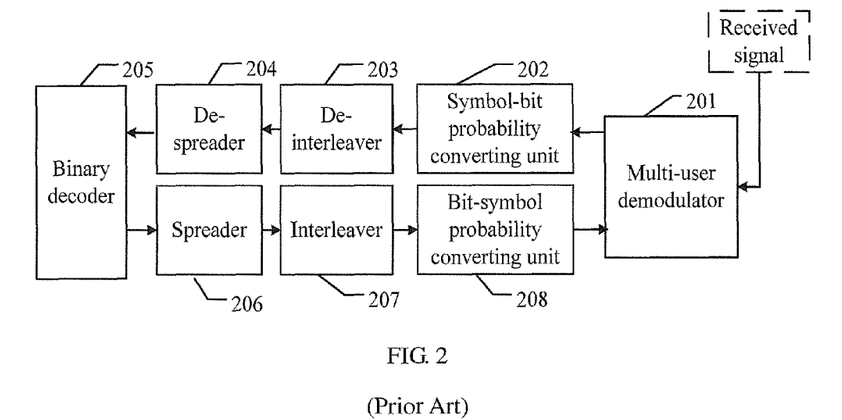
FIG. 2 shows an IDMA receiver apparatus under high-order modulation in the prior art.

FIG. 2 shows an IDMA receiver apparatus under high-order modulation in the prior art. The apparatus includes a multi-user demodulator 201, a symbol-bit probability converting unit 202, a de-interleaver 203, a de-spreader 204, a binary decoder 205, a spreader 206, an interleaver 207, and a bit-symbol probability converting unit 208. The detailed process is as follows:

In the forward link, the multi-user demodulator 201 calculates the symbol posteriori probability information for the received symbol sequence. The symbol posteriori probability information is processed by the symbol-bit probability converting unit 202 into bit posteriori probability information, and the bit posteriori probability information is processed by the de-interleaver 203 and the de-spreader 204, and then input to the binary decoder 205 for decoding.

In the reverse link, the binary decoder 205 outputs the bit priori probability information of the encoded sequence to the spreader 206. The spread bit priori probability information after being spread by the spreader 206 passes through the interleaver 207, and is input to the bit-symbol probability converting unit 208. The bit priori probability information is converted into symbol priori probability information, which is sent to the multi-user demodulator 201 again for the next iterative operation until the preset maximum iterative count is met.

The prior art reveals that: First, binary codes are used for data transmission in the prior art, but the binary codes are not much capable of error correction or resisting burst errors; second, in the transmitter solution in the prior art, after passing through the spreader and the interleaver, the encoded bit data is mapped to symbol data for sending. Because the number of data units of the bit data is greater than the number of data units of the symbol data, the spreader and the interleaver need to perform plenty of operations, thus leading to much complexity of operation in the prior art.

Further, in the receiver solution in the prior art, the data is transmitted in the binary code mode, namely, the binary decoder can identify only the bit probability information. Therefore, the receiver needs to convert the symbol probability information into bit probability information after receiving the symbol sequence and calculating out the symbol probability information of the symbol sequence, and then the information can be referred to the binary decoder. Likewise, the binary decoder outputs bit probability information, which needs iteration, and the bit probability information needs to be converted into symbol probability information. Therefore, in the case of high-order modulation, the receiver needs to perform frequent conversion between the symbol probability information and the bit probability information, thus leading to much complexity of operation.

Further still, in the conversion between the symbol probability information and the bit probability information, information may be lost, the coding gain is partially lost, and the system performance is affected.

SUMMARY

The embodiments of the present invention provide an apparatus for transmitting multi-ary error-correcting codes, an apparatus for receiving multi-ary error-correcting codes, a data transmission system, and relevant methods.

An apparatus for transmitting multi-ary error-correcting codes provided in an embodiment of the present invention includes:

a multi-ary channel encoder, adapted to perform multi-ary encoding for source data frames of a user to obtain encoded sequences;

a symbol mapper, adapted to perform symbol mapping for the encoded sequences to obtain symbol sequences; and a spreading and interleaving unit, adapted to spread and interleave the symbol sequences.

An apparatus for transmitting multi-ary error-correcting codes provided in an embodiment of the present invention includes:

a multi-ary channel encoder, adapted to perform multi-ary coding for source data frames of a user to obtain encoded sequences;

a grouping device, adapted to group the encoded sequences to obtain grouped sequences;

a user interleaver, adapted to interleave the grouped sequences to obtain interleaved sequences;

a symbol mapper, adapted to perform symbol mapping for the interleaved sequences to obtain symbol sequences; and a spreader, adapted to spread the symbol sequences to obtain spreading sequences.

An apparatus for receiving multi-ary error-correcting codes provided in an embodiment of the present invention includes:

a multi-user demodulator, adapted to receive sequences and calculate the received sequences to obtain symbol posteriori probability sequences;

a de-spreading and de-interleaving unit, adapted to perform de-spreading and de-interleaving for the symbol posteriori probability sequences;

a multi-ary decoder, adapted to decode the de-spread and de-interleaved sequences, output symbol priori probability sequences, work with the multi-user demodulator to perform iterative operations, judge whether a count of iterations reaches a preset threshold, and output decoding results if the count of the iterations reaches the preset threshold; and a spreading and interleaving unit, adapted to spread and interleave the symbol priori probability sequences, and send the spread and interleaved sequences to the multi-user demodulator.

A data transmission system provided in an embodiment of the present invention includes an apparatus for transmitting multi-ary error-correcting codes and an apparatus for receiving multi-ary error-correcting codes.

The apparatus for transmitting multi-ary error-correcting codes includes:

a multi-ary channel encoder, adapted to perform multi-ary encoding for source data frames of a user to obtain encoded sequences;

a symbol mapper, adapted to perform symbol mapping for the encoded sequences to obtain symbol sequences; and a spreading and interleaving unit, adapted to spread and interleave the symbol sequences;

The apparatus for receiving multi-ary error-correcting codes includes:

a multi-user demodulator, adapted to receive sequences and calculate the received sequences to obtain symbol posteriori probability sequences;

a de-spreading and de-interleaving unit, adapted to perform de-spreading and de-interleaving for the symbol posteriori probability sequences;

a multi-ary decoder, adapted to: decode the de-spread and de-interleaved sequences, output symbol priori probability sequences, work with the multi-user demodulator to perform iterative operations, judge whether a count of iterations reaches a preset threshold, and output decoding results if the count of the iterations reaches the preset threshold; and a spreading and interleaving unit, adapted to spread and interleave the symbol priori probability sequences, and send the spread and interleaved sequences to the multi-user demodulator.

A method for transmitting multi-ary error-correcting codes provided in an embodiment of the present invention includes:

performing multi-ary coding for source data frames of a user to obtain encoded sequences;

performing symbol mapping for the encoded sequences to obtain symbol sequences; and preprocessing the symbol sequences; and transmitting the preprocessed sequences.

A method for receiving multi-ary error-correcting codes provided in an embodiment of the present invention includes:

calculating received sequences to obtain symbol posteriori probability sequences;

de-spreading the symbol posteriori probability sequences to obtain de-spread symbol posteriori probability sequences;

de-interleaving the de-spread symbol posteriori probability sequences to obtain de-interleaved symbol posteriori probability sequences;

decoding the de-interleaved symbol posteriori probability sequences, outputting symbol priori probability sequences, working with a multi-user demodulator to perform iterative operations, judging whether a count of iterations reaches a preset threshold, and outputting decoding results if the count of the iterations reaches the preset threshold;

interleaving the symbol priori probability sequences to obtain interleaved symbol priori probability sequences; and spreading the interleaved symbol priori probability sequences to obtain spread symbol priori probability sequences, and sending the spread symbol priori probability sequences to the multi-user demodulator to undergo joint iterative operations.

A method for receiving multi-ary error-correcting codes provided in an embodiment of the present invention includes:

calculating received sequences to obtain symbol posteriori probability sequences;

de-interleaving the symbol posteriori probability sequences to obtain de-interleaved symbol posteriori probability sequences;

de-spreading the de-interleaved symbol posteriori probability sequences to obtain de-spread symbol posteriori probability sequences;

decoding the de-spread symbol posteriori probability sequences, outputting symbol priori probability sequences, working with a multi-user demodulator to perform iterative operations, judging whether a count of iterations reaches a preset threshold, and outputting decoding results if the count of the iterations reaches the preset threshold;

spreading the symbol priori probability sequences to obtain spread symbol priori probability sequences; and interleaving the spread symbol priori probability sequences to obtain interleaved symbol priori probability sequences, and sending the interleaved symbol priori probability sequences to the multi-user demodulator to undergo joint iterative operations.

DETAILED DESCRIPTION OF THE EMBODIMENTS

The embodiments of the present invention provide an apparatus for transmitting multi-ary error-correcting codes, an apparatus for receiving multi-ary error-correcting codes, a data transmission system, and relevant methods to simplify operation.

The embodiments of the present invention perform data transmission based on multi-my codes (namely, multi-ary error-correcting codes) encoding and decoding. Multi-ary codes refer to multi-ary error-correcting codes based on high-order Finite Field structures. If a field includes a finite number of elements, the domain is called a Finite Field (e.g. Galois Field, GF).

Research indicates that the performance of multi-ary codes is better than the performance of the traditional binary codes. Therefore, the embodiments of the present invention provides better error correction performance and is more capable of resisting burst errors and more suitable for high-rate transmission.

Based on the multi-ary codes, multiple modes of transmitting and receiving multi-ary error-correcting codes are provided herein, as detailed below.

Figure 3:
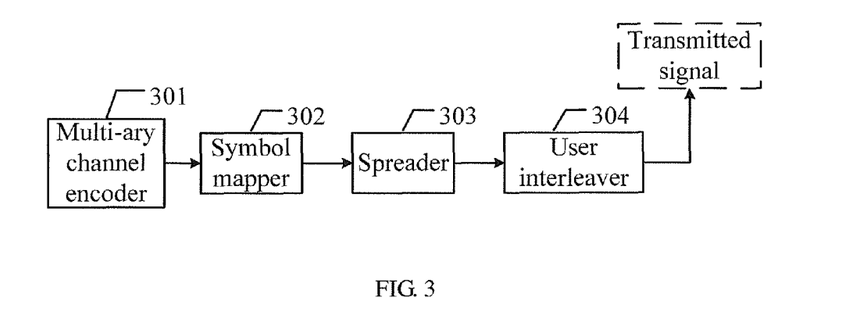
FIG. 3 shows an apparatus for transmitting multi-ary error-correcting codes in the first embodiment of the present invention.

As shown in FIG. 3, an apparatus for transmitting multi-ary error-correcting codes in the first embodiment of the present invention includes:

a multi-ary channel encoder 301, adapted to perform multi-ary coding for source data frames of a user to obtain encoded sequences;

a symbol mapper 302, adapted to perform symbol mapping for the encoded sequences to obtain symbol sequences;

a spreader 303, adapted to spread the symbol sequences to obtain spreading sequences; and a user interleaver 304, adapted to interleave the spreading sequences to obtain interleaved sequences.

The detailed transmitting process in this embodiment is as follows:

Assume that the source data frames input by a user k are $b_k=\{b_{k,0}, b_{k,1}, \ldots, b_{k,m}, \ldots\}$, and $b_k$ is processed by a multi-ary channel encoder 301 into a encoded sequence $c_k$, where m represents the serial number of the encoded sequence.

The structure of the multi-ary channel encoder 301 and the encoding process are covered by the prior art, and are not repeated here any further.

It is to be noted that in a traditional IDMA system, the channel encoder in use is based on binary codes, and the encoded sequence is a bit-level sequence, namely, the sequence is composed of separate bits. This sequence is still a bit-level sequence after being processed by the spreader.

When the channel encoder used by the transmitter apparatus is based on multi-ary codes, the sequence output by the multi-ary channel encoder 301 is not a simple bit-level sequence, but an element composed of several bits. Several elements make up an encoded sequence $c_k=\{c_{k,0}, c_{k,1}, \ldots, c_{k,m}, \ldots\}$.

It is assumed that the multi-ary channel encoder is defined on a Galois field $GF(2^q)$ where q is a natural number. Every q continuous bits in the encoded sequence $c_k$ corresponds to a specific symbol. Specifically, after $c_k$ passes through the symbol mapper 302, a symbol sequence $s_k=\{s_{k,0}, s_{k,1}, \ldots, s_{k,m}, \ldots\}$ is output.

The operation corresponding to the symbol mapper 302 is to map every q continuous bits in the encoded sequence $c_k$ to a symbol, namely, map $\{c_{k,qm}, c_{k,qm+1}, c_{k,qm+q-1}\}$ to a symbol $\{s_{k,m}\}$ (m=0, 1, ...). Therefore, the length of the symbol sequence $s_k$ output by the symbol mapper 302 is equal to 1/q of the length of the encoded sequence $c_k$ input to the symbol mapper 301.

In the existing solution based on binary codes, the source data frames of the user are binary-encoded first to generate bit-level encoded sequences (namely, each element in the encoded sequence is a bit). The symbol mapper maps several bit-level elements to a symbol. In this embodiment, however, the source data frames of the user are multi-ary encoded first. In the generated encoded sequences, each element is no longer a separate bit, but an element composed of several bits and generated in the multi-ary encoding process. The symbol mapper maps such several elements to a symbol, as a result, it can reduce the data after mapping and simplify the subsequent calculation.

The symbol mapper 302 inputs the symbol sequence $s_k$ to a spreader 303 for spreading spectrum to obtain a spreading sequence $v_k=\{v_{k,0}, v_{k,1}, \ldots, v_{k,L-1}\}$. The spreading sequence $v_k=\{v_{k,0}, v_{k,1}, \ldots, v_{k,L-1}\}$ indicates a spreading sequence obtained after the symbol sequence of user k is spread by the spreader 303, with the length being L.

The spreading sequence is input to the user interleaver 304 for interleaving to obtain an interleaved sequence $x_k=\{x_{k,0}, x_{k,1}, \ldots, x_{k,L-1}\}$. The interleaved sequence $x_k=\{x_{k,0}, x_{k,1}, \ldots, x_{k,L-1}\}$ indicates a sequence obtained after the spreading sequence of user k is interleaved by the user interleaver 304, with the length being L. The user interleaver 304 used in this embodiment may be the same as or different from the interleaver in the existing IDMA system. When all users use the same spreader, the users need to use different interleavers; when the users use different spreaders, the users may use the same or different interleavers.

In this embodiment, the multi-ary codes transmitting process also involves a spreading spectrum process and an interleaving process, the spreading spectrum means the bandwidth of the channel occupied by the transmitted signal is much wider than the minimum bandwidth required by the information, and the interleaving means rearranging the encoded signals according to certain rules, generally based on different users, therefore, after the interleaving, the signals sent by different users can be identified effectively. The spreading spectrum process and the interleaving process in this embodiment improve the efficiency of transmitting multi-ary codes.

In this embodiment, the symbol mapping is performed before spreading and interleaving, thus it can reduce the data units and simplify the operations of spreading and interleaving.

Figure 4:
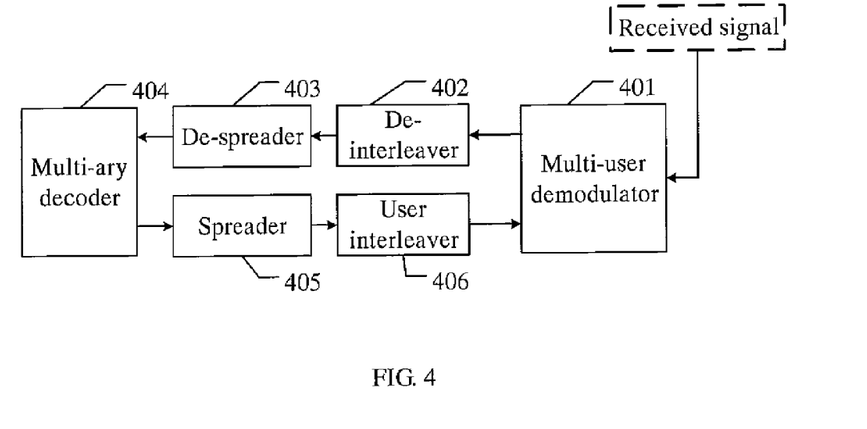
FIG. 4 shows an apparatus for receiving multi-ary error-correcting codes in the first embodiment of the present invention.

Corresponding to the foregoing transmitting apparatus, as shown in FIG. 4, an apparatus for receiving multi-ary error-correcting codes in the first embodiment of the present invention includes:

a multi-user demodulator 401, adapted to receive sequences and calculate the received sequences to obtain symbol posteriori probability sequences;

a de-interleaver 402, adapted to de-interleave the symbol probability sequences to obtain de-interleaved symbol posteriori probability sequences;

a de-spreader 403, adapted to de-spread the de-interleaved symbol posteriori probability sequences to obtain de-spread symbol posteriori probability sequences;

a multi-ary decoder 404, adapted to: decode the de-spread symbol posteriori probability sequences, output symbol priori probability sequences, work with a multi-user demodulator 401 to perform iterative operations, judge whether the count of iterations reaches a preset threshold, and output decoding results if the count of iterations reaches the preset threshold;

a spreader 405, adapted to spread the symbol priori probability sequences to obtain spread symbol priori probability sequences; and a user interleaver 406, adapted to interleave the spread symbol priori probability sequences to obtain interleaved symbol priori probability sequences.

The apparatus for receiving multi-ary error-correcting codes in this embodiment includes two links: a forward link and a reverse link. The receiving apparatus needs to perform iterative operation decoding through the forward link and the reverse link, and output the decoding results when the preset condition is fulfilled. The preset condition in this embodiment refers to the count of iterative operations reaches the preset threshold while the multi-user demodulator 401 and the multi-ary decoder 404 perform the demodulation and decoding process cyclically. The receiving process is detailed below.

In the forward link, the received signal is sent to the multi-user demodulator 401 to calculate an estimate value of the symbol sequence $x_k = \{x_{k,0}, x_{k,1}, \ldots, x_{k,L-1}\}$ to user k. The estimate value is $\{e_{ese}(x_k(j))\}$, where j represents the serial number of the received sequence. The estimate value is a probability sequence, namely, a symbol posteriori probability sequence, which is composed of the posteriori probability value of every transmitted symbol. The calculation method is covered by the prior art.

This embodiment uses a single user (user k) as an example. In practice, a multi-user demodulator 401 may process the symbol sequences sent by multiple users.

After the $\{e_{ese}(x_k(j))\}$ passes through the de-interleaver 402, a de-interleaved sequence $\{e_{ese}(v_k(j))\}$ is output.

The process executed by the de-interleaver 402 is an inverse of the process executed by the user interleaver 304 in FIG. 3. After the $\{e_{ese}(v_k(j))\}$ sequence passes through the de-spreader 403, a de-spreading sequence $\{e_{ese}(s_k(j))\}$ is output.

The process executed by the de-spreader 403 is an inverse of the process executed by the spreader 303 in FIG. 3, and the detailed process is covered by the prior art.

The $\{e_{ese}(s_k(j))\}$ sequence is sent to the multi-ary decoder 404 directly.

The multi-ary decoder 404 is adapted to: decode the de-interleaved symbol posteriori probability sequences, output symbol priori probability sequences, work with a multi-user demodulator 401 to perform iterative operations, judge whether the count of iterations reaches a preset threshold, and output decoding results if the count of iterations reaches the preset threshold.

As the multi-ary decoder 404 can process the multi-ary error-correcting codes, and identify the symbol posteriori probability, which does not need to be converted into the bit posteriori probability, therefore, the operation is simplified.

In the prior art based on binary codes, each symbol in the symbol sequence transmitted by the transmitter is composed of several bit-level elements; the receiver includes the corresponding binary decoder; after calculating out the symbol posteriori probability sequence according to the symbol sequence transmitted by the user, the multi-user demodulator needs to convert the symbol posteriori probability sequence into the bit posteriori probability sequence so that the probability sequence is identifiable to the binary decoder. In this embodiment, multi-ary codes are used in the transmitter, and the receiver includes the corresponding multi-ary decoder 404; after calculating out the symbol posteriori probability sequence according to the symbol sequence transmitted by the user, the multi-user demodulator 401 can recover the symbol posteriori probability sequence and send it to the multi-ary decoder 404 for decoding, without involving any conversion of the probability sequence, and therefore, the operation is simplified.

In the reverse link, the multi-ary decoder 404 outputs an estimate value of the transmitted symbol sequence. The estimate value is $\{e_{dec}(s_k(j))\}$, which is a probability sequence, namely, a symbol priori probability sequence composed of the priori probability value of every transmitted symbol. The calculation method is covered by the prior art.

After the $\{e_{dec}(s_k(j))\}$ passes through the spreader 405, a spread symbol priori probability sequence $\{e_{dec}(v_k(j))\}$ is output.

The spreader 405 may be the same as the spreader 303 in FIG. 3.

After the $\{e_{dec}(v_k(j))\}$ passes through the user interleaver 406, an interleaved symbol priori probability sequence $\{e_{dec}(x_k(j))\}$ is output. The user interleaver 406 may be the same as the user interleaver 304 in FIG. 3.

The $\{e_{dec}(x_k(j))\}$ is sent to the multi-user demodulator 401 for the next iterative operation.

The foregoing process recurs iteratively until the count of iterations reaches the preset threshold, whereupon the multi-ary decoder 404 outputs a decision value of the user source data frame.

The apparatus for transmitting multi-ary error-correcting codes is combined with the apparatus for receiving multi-ary error-correcting codes into a data transmission system.

Figure 5:
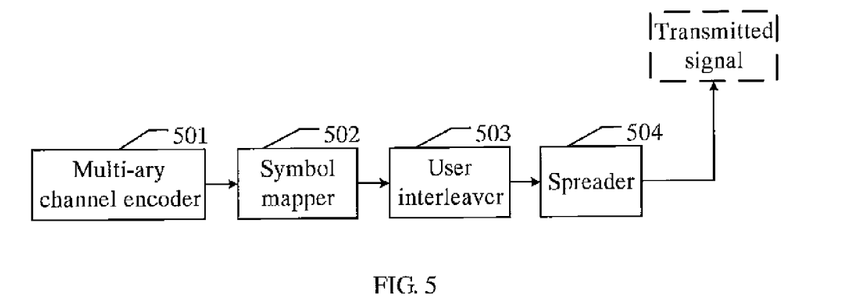
FIG. 5 shows an apparatus for transmitting multi-ary error-correcting codes in the second embodiment of the present invention.

The order of transmitting process executed by the transmitting apparatus in the foregoing embodiment is: first decoding, then mapping, then spreading spectrum, then interleaving, and transmitting. It is understandable that after the decoding and the mapping, the interleaving may occur before the spreading spectrum and the transmitting, as shown in FIG. 5. FIG. 5 shows an apparatus for transmitting multi-ary error-correcting codes in the second embodiment of the present invention. The transmitting apparatus includes:

a multi-ary channel encoder 501, adapted to perform multi-ary coding for source data frames of a user to obtain encoded sequences;

a symbol mapper 502, adapted to perform symbol mapping for the encoded sequences to obtain symbol sequences, where: in the existing solution based on binary codes, the source data frames of the user are binary-encoded first to generate bit-level encoded sequences (namely, each element in the encoded sequences is a bit). The symbol mapper maps several bit-level elements into a symbol. In this embodiment, however, the source data frames of the user are multi-ary encoded first. In the generated encoded sequences, each element is no longer a separate bit, but an element composed of several bits and generated in the multi-ary coding process. The symbol mapper maps such several elements to a symbol, as a result, it can reduce the data after mapping and simplify the subsequent calculation;

a user interleaver 503, adapted to interleave the symbol sequences to obtain interleaved sequences, where the users may use the same or different user interleavers; and a spreader 504, adapted to spread the interleaved sequences to obtain spreading sequences, where the users use different spreaders.

The detailed transmitting process differs from the first embodiment of the transmitting apparatus only in that the order of the interleaving step and the spreading step is changed.

In this embodiment, the multi-ary code transmitting process includes a spreading process and an interleaving process, thus improving the efficiency of transmitting the multi-ary codes.

Figure 6:
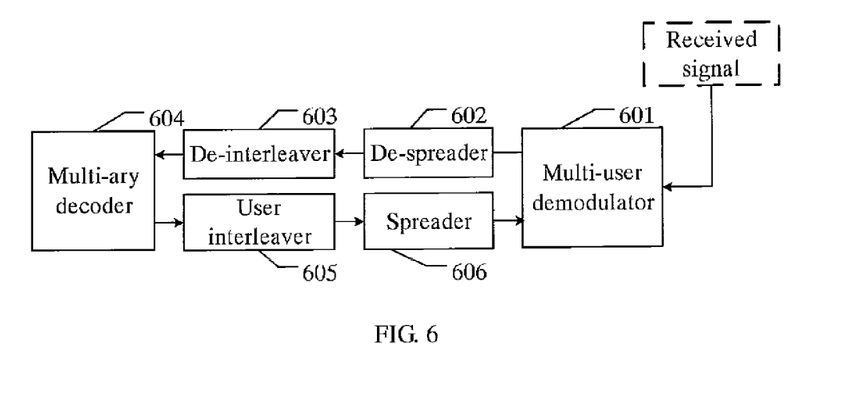
FIG. 6 shows an apparatus for receiving multi-ary error-correcting codes in the second embodiment of the present invention.

Likewise, the receiving apparatus needs to be changed accordingly, as shown in FIG. 6. FIG. 6 shows an apparatus for receiving multi-ary error-correcting codes in the second embodiment of the present invention. The receiving apparatus includes:

a multi-user demodulator 601, adapted to receive sequences and calculate the received sequences to obtain symbol posteriori probability sequences;

a de-spreader 602, adapted to de-spread the symbol posteriori probability sequences to obtain de-spread symbol posteriori probability sequences, where the process executed by the de-spreader 602 is an inverse of the process executed by the spreader 504 in FIG. 5, and the detailed process is covered by the prior art;

a de-interleaver 603, adapted to de-interleave the de-spread symbol posteriori probability sequences to obtain de-interleaved symbol posteriori probability sequences, where the process executed by the de-interleaver 603 is an inverse of the process executed by the interleaver 503 in FIG. 5, and the detailed process is covered by the prior art;

a multi-ary decoder 604, adapted to decode the de-interleaved symbol posteriori probability sequences, output symbol priori probability sequences, work with a multi-user demodulator 601 to perform iterative operations, judge whether the count of iterations reaches a preset threshold, and output decoding results if the count of iterations reaches the preset threshold, where: in the prior art based on binary codes, each symbol in the symbol sequence transmitted by the transmitter is composed of several bit-level elements; the receiver includes the corresponding binary decoder; after calculating out the symbol posteriori probability sequence according to the symbol sequence transmitted by the user, the multi-user demodulator needs to convert the symbol posteriori probability sequence into the bit posteriori probability sequence so that the probability sequence is identifiable to the binary decoder. In this embodiment, multi-ary codes are used in the transmitter, and the receiver includes the corresponding multi-ary decoder 604; after calculating out the symbol posteriori probability sequence according to the symbol sequence transmitted by the user, the multi-user demodulator 601 can recover the symbol posteriori probability sequence and send it to the multi-ary decoder 604 for decoding, without involving any conversion of the probability sequence, and therefore, the operation is simplified;

a user interleaver 605, adapted to interleave the symbol priori probability sequences to obtain interleaved symbol priori probability sequences, where the user interleaver 605 may be the same as the user interleaver 503 in FIG. 5; and a spreader 606, adapted to spread the interleaved symbol priori probability sequences to obtain spread symbol priori probability sequences, where the spreader 606 may be the same as the spreader 504 in FIG. 5.

The detailed receiving process differs from the first embodiment of the receiving apparatus only in that the order of the de-interleaving step, the de-spreading step, the interleaving step, and the spreading step is changed.

Figure 7:
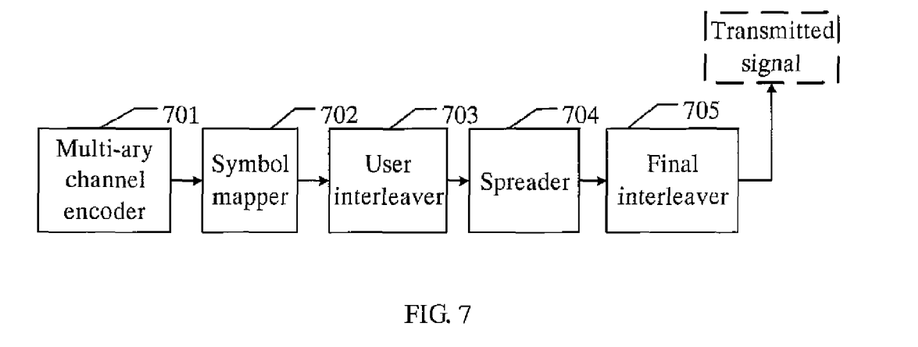
FIG. 7 shows an apparatus for transmitting multi-ary error-correcting codes in the third embodiment of the present invention.

Described above is a process of transmitting and receiving signals of a specific user in a multi-user processing process. It is understandable that on the basis of the second embodiment, the spreading sequences of all users may be interleaved finally after the spreading, as shown in FIG. 7. FIG. 7 shows an apparatus for transmitting multi-ary error-correcting codes in the third embodiment of the present invention. The transmitting apparatus includes:

a multi-ary channel encoder 701, adapted to perform multi-ary encoding for source data frames of a user to obtain encoded sequences;

a symbol mapper 702, adapted to perform symbol mapping for the encoded sequences to obtain symbol sequences;

a user interleaver 703, adapted to interleave the symbol sequences to obtain interleaved sequences, where the users may use the same or different user interleavers;

a spreader 704, adapted to spread the interleaved sequences to obtain spreading sequences; and a final interleaver 705, adapted to interleave the spreading sequences to obtain a final interleaved sequence and output it.

When all users use the same spreader 704, the users need to use different final interleavers 705; when the users use different spreaders 704, the users may use the same or different final interleavers 705.

The detailed transmitting process differs from the second embodiment of the transmitting apparatus only in that: after spreading sequences are obtained through a spreading step, the spreading sequences of all users are interleaved through a final interleaver 705 to obtain a final interleaved sequence for transmitting.

Figure 8:
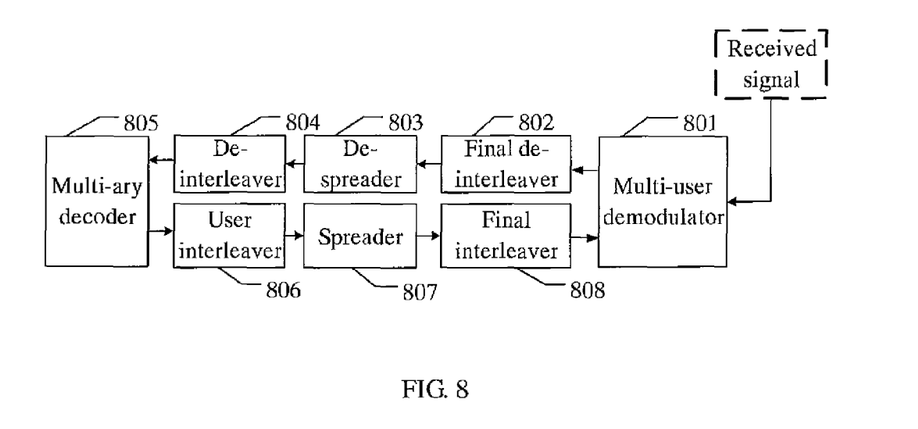
FIG. 8 shows an apparatus for receiving multi-ary error-correcting codes in the third embodiment of the present invention.

Likewise, the receiving apparatus needs to be changed accordingly, as shown in FIG. 8. FIG. 8 shows an apparatus for receiving multi-ary error-correcting codes in the third embodiment of the present invention. The receiving apparatus includes:

a multi-user demodulator 801, adapted to: receive sequences, and calculate the received sequences to obtain symbol posteriori probability sequences;

a final de-interleaver 802, adapted to: receive the symbol posteriori probability sequences calculated out by the multi-user demodulator, and de-interleave the symbol posteriori probability sequences to obtain a final de-interleaved symbol posteriori probability sequence, where the process executed by the final de-interleaver 802 is an inverse of the process executed by the final interleaver 705 in FIG. 7, and the detailed process is covered by the prior art;

a de-spreader 803, adapted to de-spread the final de-interleaved symbol posteriori probability sequence to obtain de-spread symbol posteriori probability sequences, where the process executed by the de-spreader 803 is an inverse of the process executed by the spreader 704 in FIG. 7, and the detailed process is covered by the prior art;

a de-interleaver 804, adapted to de-interleave the de-spread symbol posteriori probability sequences to obtain de-interleaved symbol posteriori probability sequences, where the process executed by the de-interleaver 804 is an inverse of the process executed by the interleaver 703 in FIG. 7, and the detailed process is covered by the prior art;

a multi-ary decoder 805, adapted to: decode the de-interleaved symbol posteriori probability sequences, output symbol priori probability sequences, work with a multi-user demodulator 801 to perform iterative operations, judge whether the count of iterations reaches a preset threshold, and output decoding results if the count of iterations reaches the preset threshold;

a user interleaver 806, adapted to interleave the symbol priori probability sequences to obtain interleaved symbol priori probability sequences, where the user interleaver 806 may be the same as the user interleaver 703 in FIG. 7;

a spreader 807, adapted to spread the interleaved symbol priori probability sequences to obtain spread symbol priori probability sequences, where the spreader 807 may be the same as the spreader 704 in FIG. 7; and a final interleaver 808, adapted to: receive the spread symbol priori probability sequences generated by the spreader 807, interleave the spread symbol priori probability sequences to obtain a final interleaved symbol priori probability sequence, and send the final interleaved symbol priori probability sequences to the multi-user demodulator 801, where the final interleaver 808 may be the same as the final interleaver 705 in FIG. 7.

The detailed receiving process differs from the second embodiment of the receiving apparatus only in that: final de-interleaving is performed before the de-spreading, and final interleaving is performed after the spreading.

In each of the foregoing embodiments, the transmitting apparatus may combine with the receiving apparatus into a data transmission system.

In the foregoing embodiments, the multi-user demodulator is adapted to calculate the received sequences to obtain symbol posteriori probability sequences. An exemplary process of calculating the symbol posteriori probability sequences is as follows:

For brevity, it is assumed that the channel has no memory effect, and the number of active users in the system is K.

The signals received from K users after passing through the matching filter at the front end of the receiver may be expressed as:

$$r(j) = \sum_{k=1}^{K} h_k x_k(j) + n(j) \quad (1)$$

$$j = 1, 2, \ldots, J$$

where $h_k$ is a channel coefficient of user k, and is a real number; n(j) is white Gaussian noise with a variance of $\sigma^2 = N_0/2$; J represents the length of the transmitted symbol sequence. It is assumed that the channel coefficient $h_k$ is known at the receiver.

Therefore, formula (1) is transformed into:

$$r(j) = h_k x_k(j) + \zeta_k(j) \quad (2a)$$

where, $$\zeta_k(j) \equiv r(j) - h_k x_k(j) = \sum_{k' \neq k} h_{k'} x_{k'}(j) + n(j) \quad (2b)$$

is distortion about user k (including interference plus noise) in r(j). According to the central limit theorem, $\zeta_k(j)$ is similar to a Gaussian variable, and r(j) may be represented by a conditional Gaussian probability density function, namely, $$P(r(j) \mid x_k(m)) = \quad (3)$$

$$\frac{1}{\sqrt{2\pi \mathrm{Var}(\zeta_k(j))}} \exp\left[-\frac{(r(j) - (h_k(j) \cdot x_k(m) + E(\zeta_k(j))))^2}{2\mathrm{Var}(\zeta_k(j))}\right]$$

where E(•) represents a mean value function and Var(•) represents a variance function.

According to the Bayes formula, $$P(x_k(m) \mid r(j)) = \frac{P(r(j) \mid x_k(m)) P(x_k(m))}{P(r(j))}. \quad (4)$$

Formula (4) represents the posteriori probability of the transmitted signal $x_k(m)$ when the received signal is r(j). It is assumed that the transmitted symbol has an equal probability and the received symbol is a definite value, namely, P(r(j))=1, formula (4) may be simplified below when the modulation mode is M-ary modulation:

$$P(x_k(m) \mid r(j)) = \frac{P(r(j) \mid x_k(m))}{M}. \quad (5)$$

According to formula (3) and (5), the formula for calculating the transmitted symbol posteriori probability $P(x_k(m)|r(j))$ is:

$$P(x_k(m) \mid r(j)) = \quad (6)$$

$$\frac{1}{M\sqrt{2\pi \mathrm{Var}(\zeta_k(j))}} \exp\left[-\frac{(r(j) - (h_k(j) \cdot x_k(m) + E(\zeta_k(j))))^2}{2\mathrm{Var}(\zeta_k(j))}\right].$$

It is to be noted that in the first iteration process, it is generally assumed that the transmitted symbol priori probability is equal. When the multi-ary decoder performs decoding and outputs the updated transmitted symbol priori probability information to the multi-user demodulator, the multi-user demodulator re-calculates the mean value and the variance of $\zeta_k(j)$ according to the information, and obtains the updated transmitted symbol posteriori probability information.

In other cases, the method for calculating the transmitted symbol posteriori probability may be deduced accordingly.

From the perspective of the transmitting apparatus, in the foregoing embodiments, symbol mapping is performed before the spreading and the interleaving. Therefore, the quantity of data units is reduced, and the operation involved in the spreading and interleaving is simplified. It is understandable that the operation in the spreading and interleaving can be simplified only if the encoded sequences are combined in a certain way to reduce data units. The following embodiment supposes that the sequences are grouped.

Figure 9:
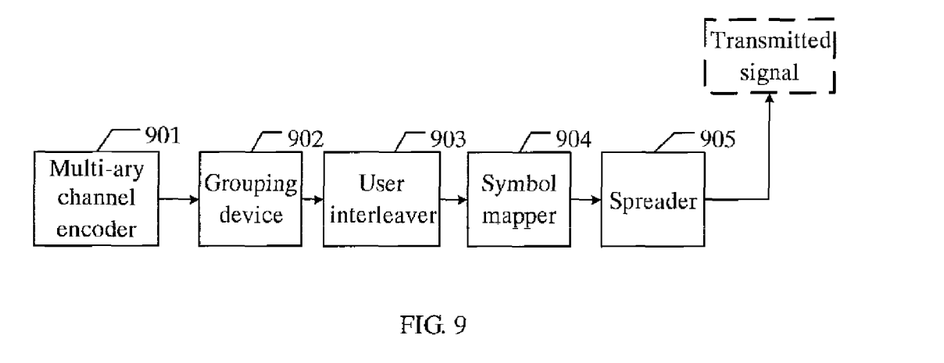
FIG. 9 shows an apparatus for transmitting multi-ary error-correcting codes in the fourth embodiment of the present invention.

As shown in FIG. 9, an apparatus for transmitting multi-ary error-correcting codes in the fourth embodiment of the present invention includes:

a multi-ary channel encoder 901, adapted to perform multi-ary encoding for source data frames of a user to obtain encoded sequences;

a grouping device 902, adapted to group the encoded sequences to obtain grouped sequences;

a user interleaver 903, adapted to interleave the grouped sequences to obtain interleaved sequences, where the users may use the same or different user interleavers;

a symbol mapper 904, adapted to perform symbol mapping for the interleaved sequences to obtain symbol sequences; and a spreader 905, adapted to spread the symbol sequences to obtain spreading sequences, where the users use different spreaders.

The detailed transmitting process is follows:

The source data frame $b_k$ of user k outputs encoded sequences $c_k$ after passing through the multi-my channel encoder 901.

The encoded sequence is expressed as $c_k=\{c_{k,0}, c_{k,1}, \ldots, c_{k,m}, \ldots\}$, where each element corresponds to a bit. It is assumed that the multi-ary channel encoder 901 is defined on a Galois field $GF(2^q)$, where q is a natural number. Every q bits in the code sequence $c_k$ corresponds to a specific symbol.

The grouping device 902 groups the encoded sequences $c_k$ using the symbol as a unit, and outputs grouped sequences $s_k$.

$s_k=\{s_{k,0}, s_{k,1}, \ldots, s_{k,m}, \ldots\}$, where each element in $s_k$ corresponds to a group of bits $\{c_{k,qm}, c_{k,qm+1}, \ldots, c_{k,qm+q-1}\}$.

After $s_k$ passes through the user interleaver 903, an interleaved sequence $v_k$ is output.

The length of $v_k$ is the same as the length of $s_k$, where the user interleaver 903 can be the interleaver used in the existing IDMA system or not.

After $v_k$ passes through the symbol mapper 904, a symbol sequence $x_k$ is output.

In the mapping process, a group of bits represented by each element of $v_k$ is mapped to a specific symbol.

After $x_k$ passes through the spreader 905, a spreading sequence $t_k$ is output.

Figure 10:
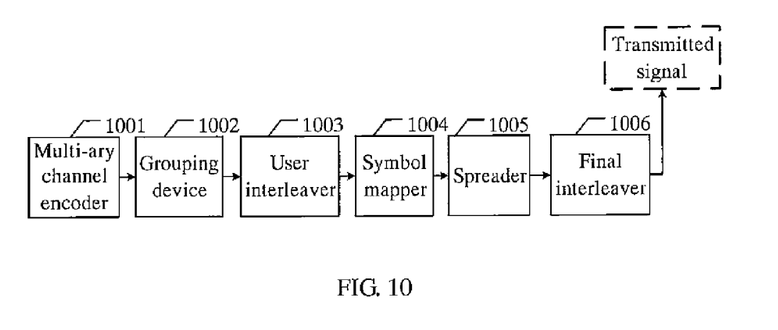
FIG. 10 shows an apparatus for transmitting multi-ary error-correcting codes in the fifth embodiment of the present invention.

Described above is a process of transmitting and receiving signals of a specific user in a multi-user processing process. It is understandable that on the basis of the fourth embodiment, the spreading sequences of all users may be interleaved finally after the spreading, as shown in FIG. 10. FIG. 10 shows an apparatus for transmitting multi-my error-correcting codes in the fifth embodiment of the present invention. The transmitting apparatus includes:

a multi-ary channel encoder 1001, adapted to perform multi-ary coding for source data frames of a user to obtain encoded sequences;

a grouping device 1002, adapted to group the encoded sequences to obtain grouped sequences;

a user interleaver 1003, adapted to interleave the grouped sequences to obtain interleaved sequences, where the users may use the same or different user interleavers;

a symbol mapper 1004, adapted to perform symbol mapping for the interleaved sequences to obtain symbol sequences;

a spreader 1005, adapted to spread the symbol sequences to obtain spreading sequences; and a final interleaver 1006, adapted to interleave the spreading sequences to obtain a final interleaved sequence and output it.

When all users use the same spreader 1005, the users need to use different final interleavers 1006; when the users use different spreaders 1005, the users may use the same or different final interleavers 1006.

The detailed transmitting process differs from the fourth embodiment of the transmitting apparatus only in that: after the spreading, the spreading sequences of all users are interleaved to obtain a final interleaved sequence and the final interleaved sequence is sent.

Figure 11:
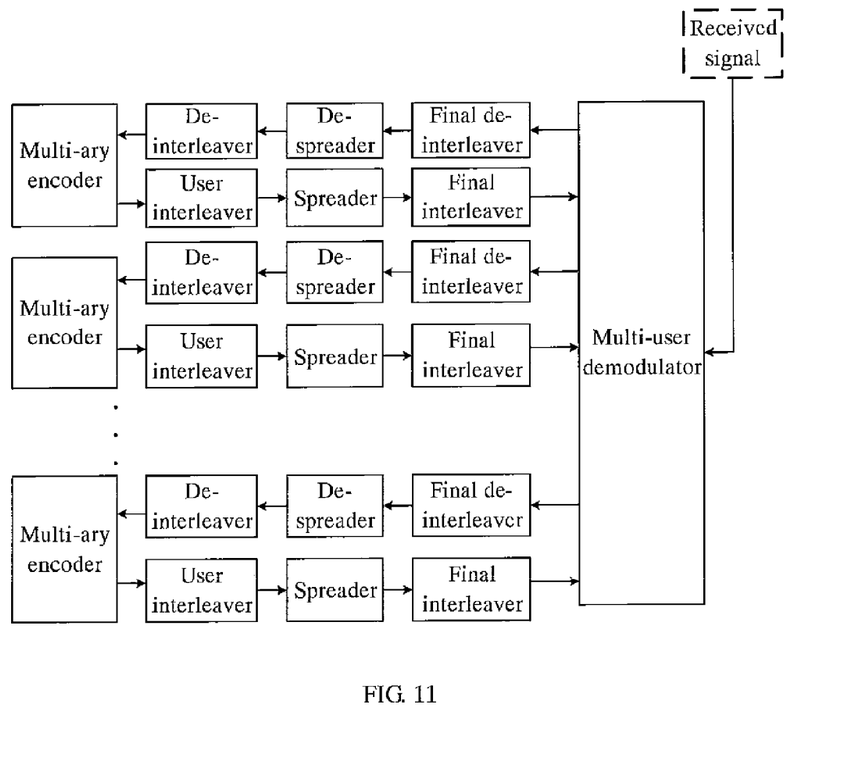
FIG. 11 is an overall schematic diagram of an apparatus for receiving multi-ary error-correcting codes in an embodiment of the present invention.

In the foregoing embodiments, the signals from a specific user are transmitted and received in the multi-user processing process, namely, the schematic diagrams above illustrates the process of transmitting and receiving signals of a specific user. In practice, the multi-user demodulator in the receiving apparatus is connected with more than one user, as shown in FIG. 11. FIG. 11 is based on the third embodiment of the apparatus for receiving multi-ary error-correcting codes, but it is understandable that the figure may be based on other embodiments of the receiving apparatus.

Relevant methods are provided herein. A method for transmitting multi-ary error-correcting codes provided in an embodiment of the present invention includes:

performing multi-ary coding for source data frames of a user to obtain encoded sequences;

performing symbol mapping for the encoded sequences to obtain symbol sequences;

preprocessing the symbol sequences; and transmitting the preprocessed sequences.

Figure 12:
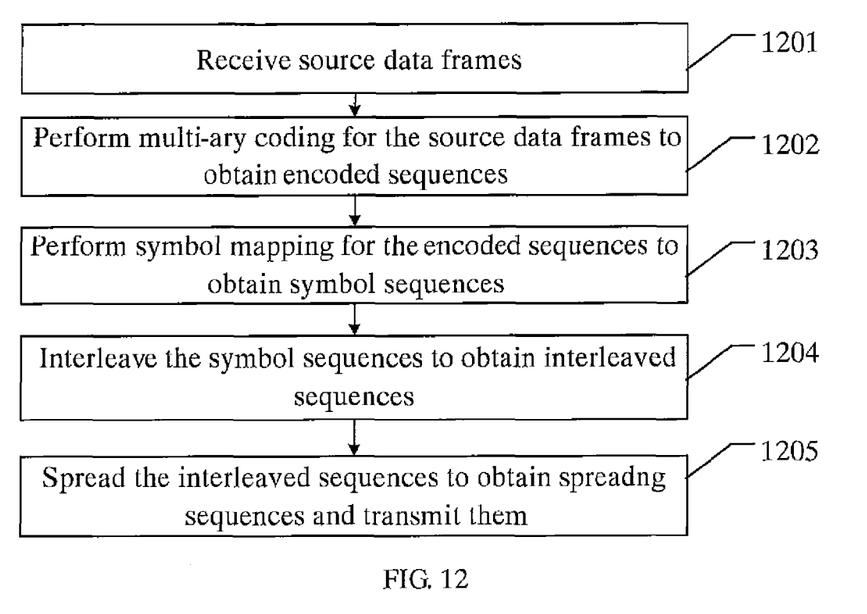
FIG. 12 is a flowchart of a method for transmitting multi-ary error-correcting codes in the first embodiment of the present invention.

The preprocessing comes in the following two types:

(A) After the symbol mapping, interleaving occurs before spreading:

As shown in FIG. 12, a method for transmitting multi-ary error-correcting codes in the first embodiment of the present invention includes the following blocks:

1201: Receive source data frames sent by the user.

1202: Perform multi-ary coding for the source data frames to obtain encoded sequences.

1203: Perform symbol mapping for the encoded sequences to obtain symbol sequences.

1204: Interleave the symbol sequences to obtain interleaved sequences.

1205: Spread the interleaved sequences to obtain spreading sequences and transmit them.

For the instances and detailed description about the process, see the description about the embodiments of the apparatus for transmitting multi-ary error-correcting codes above.

It is understandable that in this embodiment, the spreading sequences may be interleaved finally before being transmitted.

Figure 13:
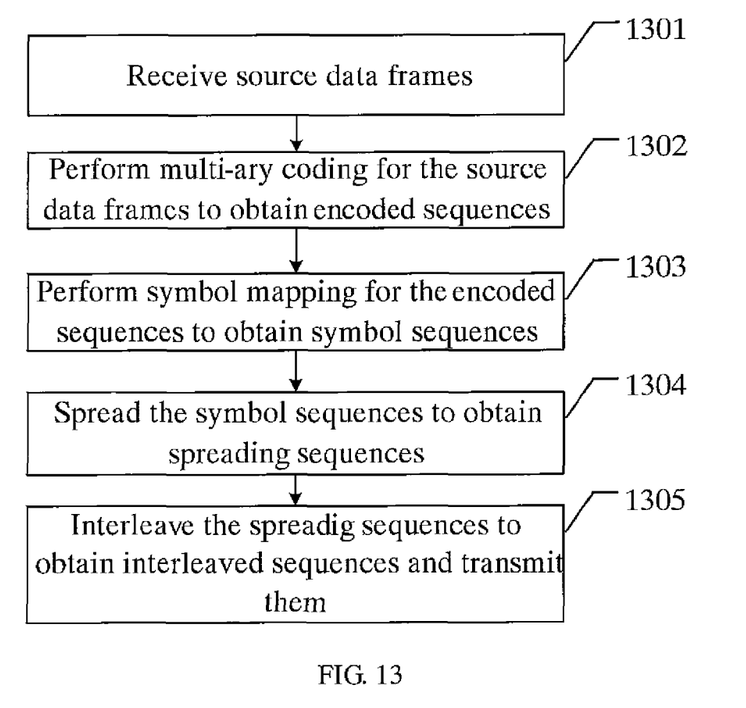
FIG. 13 is a flowchart of a method for transmitting multi-ary error-correcting codes in the second embodiment of the present invention.

(B) After the symbol mapping, spreading occurs before interleaving:

As shown in FIG. 13, a method for transmitting multi-ary error-correcting codes in the second embodiment of the present invention includes the following blocks:

1301: Receive source data frames sent by the user.

1302: Perform multi-ary coding for the source data frames to obtain encoded sequences.

1303: Perform symbol mapping for the encoded sequences to obtain symbol sequences.

1304: Spread the symbol sequences to obtain spreading sequences.

1305: Interleave the spreading sequences to obtain interleaved sequences and transmit them.

For the instances and detailed description about the process, see the description about the embodiments of the apparatus for transmitting multi-ary error-correcting codes above.

Figure 14:
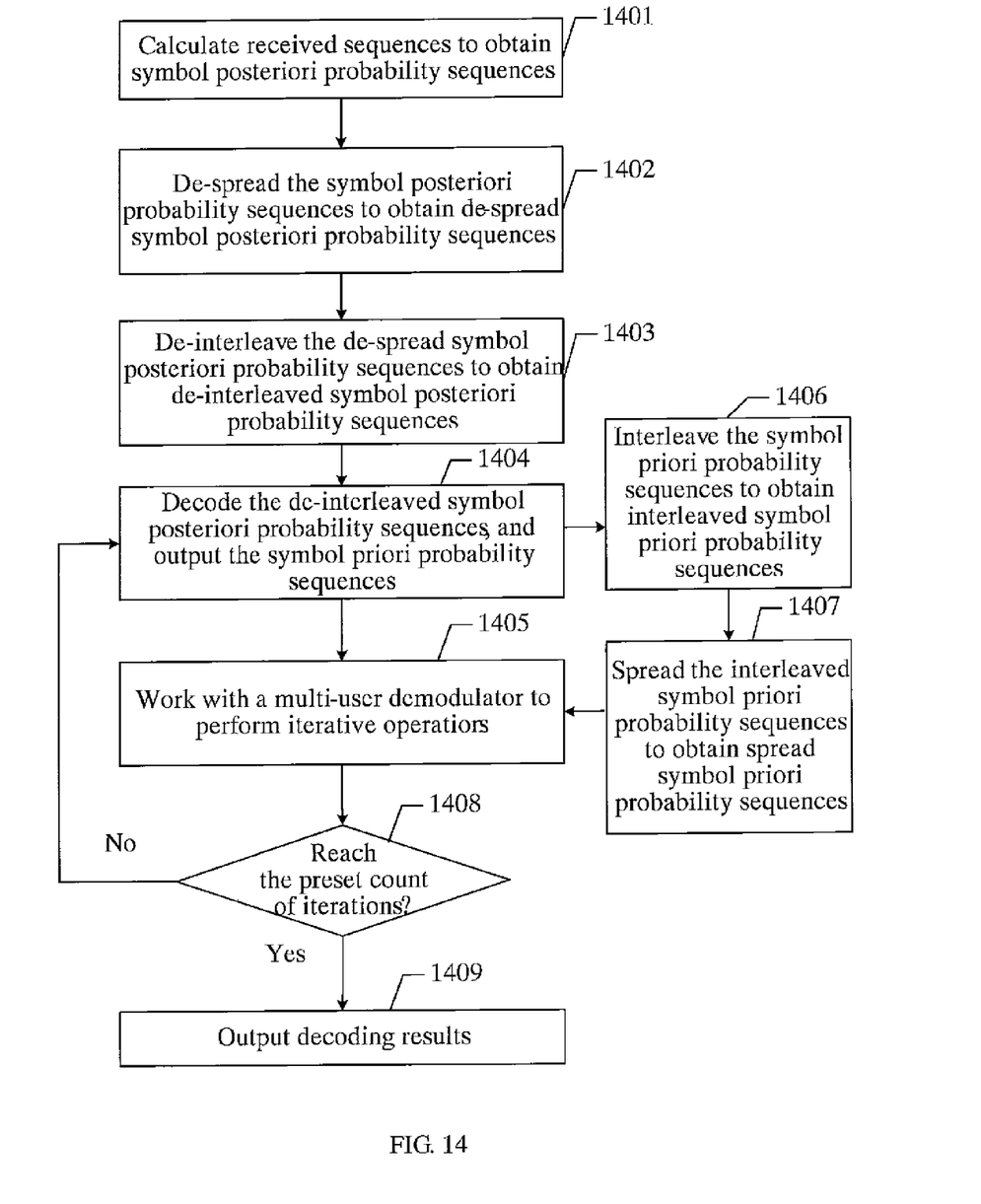
FIG. 14 is a flowchart of a method for receiving multi-ary error-correcting codes in the first embodiment of the present invention.

A method for receiving multi-ary error-correcting codes is put forward herein. As shown in FIG. 14, a method for receiving multi-ary error-correcting codes in the first embodiment of the present invention includes the following blocks:

1401: Calculate received sequences to obtain symbol posteriori probability sequences.

1402: De-spread the symbol posteriori probability sequences to obtain de-spread symbol posteriori probability sequences.

1403: De-interleave the de-spread symbol posteriori probability sequences to obtain de-interleaved symbol posteriori probability sequences.

1404: Decode the de-interleaved symbol posteriori probability sequences, output symbol priori probability sequences, and then perform iterative operations for the symbol priori probability sequences, and perform block 1406.

1405: Work with a multi-user demodulator to perform iterative operations.

1406: Interleave the symbol priori probability sequences to obtain interleaved symbol priori probability sequences.

1407: Spread the interleaved symbol priori probability sequences to obtain spread symbol priori probability sequences, and perform iterative operations through block 1405.

1408: Judge whether the count of iterations reaches the preset threshold; if the count of iterations reaches the preset threshold, perform block 1409, otherwise, perform block 1404.

1409: After the iteration is complete, output the decoding results.

For the instances and detailed description about the process, see the description about the embodiments of the apparatus for receiving multi-ary error-correcting codes above.

In this embodiment, the following block may be added between block 1401 and block 1402: De-interleave the symbol posteriori probability sequences to obtain a final de-interleaved symbol posteriori probability sequence, and send the final de-interleaved symbol posteriori probability sequence to the de-spreader.

The additional blocks occur when the transmitting method includes a final interleaving receiving process.

In this embodiment, the following block may be added after block 1404: Interleave the spread symbol priori probability sequences to obtain a final interleaved symbol priori probability sequence, and send the final interleaved symbol priori probability sequence to the multi-user demodulator.

Figure 15:
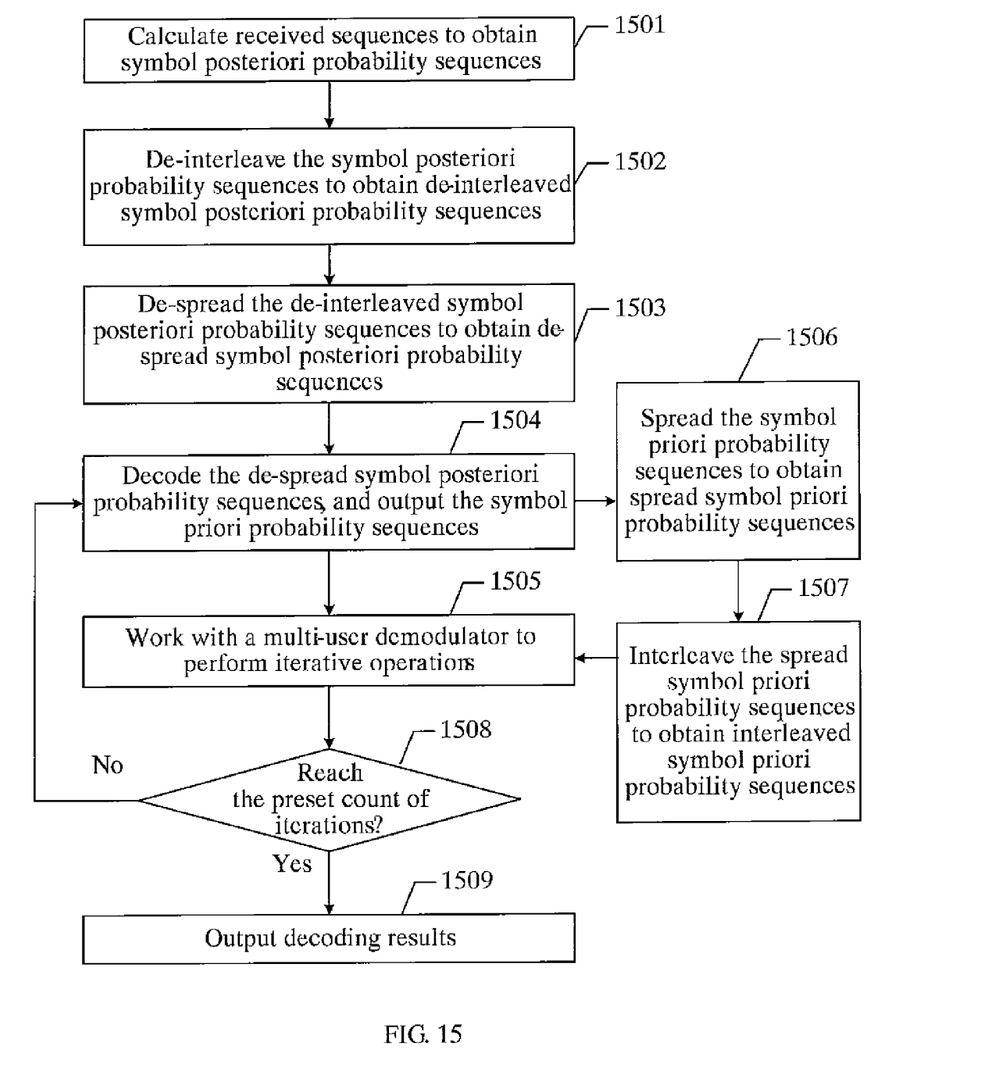
FIG. 15 is a flowchart of a method for receiving multi-ary error-correcting codes in the second embodiment of the present invention.

As shown in FIG. 15, a method for receiving multi-ary error-correcting codes in the second embodiment of the present invention includes the following blocks:

1501: Calculate received sequences to obtain symbol posteriori probability sequences.

1502: De-interleave the symbol posteriori probability sequences to obtain de-interleaved symbol posteriori probability sequences.

1503: De-spread the de-interleaved symbol posteriori probability sequences to obtain de-spread symbol posteriori probability sequences.

1504: Decode the de-spread symbol posteriori probability sequences, output symbol priori probability sequences, and then perform iterative operations for the symbol priori probability sequences, and perform block 1506.

1505: Work with a multi-user demodulator to perform iterative operations.

1506: Spread the symbol priori probability sequences to obtain spread symbol priori probability sequences.

1507: Interleave the spread symbol priori probability sequences to obtain interleaved symbol priori probability sequences, and perform iterative operations through block 1505.

1508: Judge whether the count of iterations reaches the preset threshold; if the count of iterations reaches the preset threshold, perform block 1509, otherwise, perform block 1504.

1509: After the iteration is completed, output the decoding results.

For the instances and detailed description about the process, see the description about the embodiments of the apparatus for receiving multi-ary error-correcting codes above.

It is understandable to those skilled in the art that all or part of the blocks of the foregoing embodiments may be implemented by hardware instructed by a computer program. The program may be stored in a computer-readable storage medium. The storage medium may be a Read-Only Memory (ROM), magnetic disk, or Compact Disk (CD).

Elaborated above are an apparatus for transmitting multi-ary error-correcting codes, an apparatus for receiving multi-ary error-correcting codes, a data transmission system, and relevant methods under the present invention. Although the invention is described through some exemplary embodiments, the invention is not limited to such embodiments. It is apparent that those skilled in the art can make modifications and variations to the invention without departing from the spirit and scope of the invention. The invention is intended to cover such modifications and variations provided that they fall in the scope of protection defined by the following claims or their equivalents.

What is claimed is:

1. An apparatus for receiving multi-ary error-correcting codes, comprising:
a multi-user demodulator, adapted to receive sequences and calculate the received sequences to obtain symbol posteriori probability sequences;
a de-spreading and de-interleaving unit, adapted to perform de-spreading and de-interleaving for the symbol posteriori probability sequences to obtain de-spread and de-interleaved sequences, the de-spreading and de-interleaving unit comprising,
a de-interleaver, adapted to de-interleave the symbol posteriori probability sequences to obtain the de-interleaved symbol posteriori probability sequences, and
a de-spreader, adapted to de-spread the de-interleaved symbol posteriori probability sequences to obtain the de-spread symbol posteriori probability sequences;
a multi-ary decoder, adapted to decode the de-spread and de-interleaved sequences, output symbol priori probability sequences, work with the multi-user demodulator to perform iterative operations, judge whether a count of iterations reaches a preset threshold, and output decoding results if the count of the iterations reaches the preset threshold; and
a spreading and interleaving unit, adapted to spread and interleave the symbol priori probability sequences, and send the spread and interleaved sequences to the multi-user demodulator to undergo joint iterative operations.

2. The apparatus for receiving multi-ary error-correcting codes of claim 1, further comprising:
a final de-interleaver, adapted to: receive the symbol posteriori probability sequences calculated out by the multi-user demodulator, de-interleave the symbol posteriori probability sequences to obtain a final de-interleaved symbol posteriori probability sequence, and send the final de-interleaved symbol posteriori probability sequence to the de-spreader; and a final interleaver, adapted to: receive the spread symbol priori probability sequences generated by the spreader, interleave the spread symbol priori probability sequences to obtain a final interleaved symbol priori probability sequence, and send the final interleaved symbol priori probability sequence to the multi-user demodulator.

3. The apparatus for receiving multi-ary error-correcting codes of claim 1, wherein:

the multi-ary decoder decodes the de-spread symbol posteriori probability sequences;

the spreading and interleaving unit comprises:

a spreader, adapted to spread the symbol priori probability sequences to obtain the spread symbol priori probability sequences; and a user interleaver, adapted to interleave the spread symbol priori probability sequences to obtain the interleaved symbol priori probability sequences, and send the interleaved symbol priori probability sequences to the multi-user demodulator to undergo joint iterative operations.

4. A data transmission system, comprising an apparatus for transmitting multi-ary error-correcting codes and an apparatus for receiving multi-ary error-correcting codes, wherein:

the apparatus for transmitting multi-ary error-correcting codes comprises:

a multi-ary channel encoder, adapted to perform multi-ary encoding for source data frames of a user to obtain encoded sequences;

a symbol mapper, adapted to perform symbol mapping for the encoded sequences to obtain symbol sequences; and a spreading and interleaving unit, adapted to spread and interleave the symbol sequences, the spreading and interleaving unit comprising, a spreader, adapted to spread the symbol sequences to obtain spreading sequences, and an interleaver, adapted to interleave the spreading sequences to obtain interleaved sequences; and the apparatus for receiving multi-ary error-correcting codes comprises:

a multi-user demodulator, adapted to receive sequences and calculate the received sequences to obtain symbol posteriori probability sequences;

a de-spreading and de-interleaving unit, adapted to perform de-spreading and de-interleaving for the symbol posteriori probability sequences;

a multi-ary decoder, adapted to: decode the de-spread and de-interleaved sequences, output symbol priori probability sequences, work with the multi-user demodulator to perform iterative operations, judge whether a count of iterations reaches a preset threshold, and output decoding results if the count of the iterations reaches the preset threshold; and a spreading and interleaving unit, adapted to spread and interleave the symbol priori probability sequences, and send the spread and interleaved sequences to the multi-user demodulator.

5. A method for receiving multi-ary error-correcting codes, comprising:

calculating received sequences to obtain symbol posteriori probability sequences;

de-interleaving the symbol posteriori probability sequences to obtain de-interleaved symbol posteriori probability sequences;

de-spreading the de-interleaved symbol posteriori probability sequences to obtain de-spread symbol posteriori probability sequences;

decoding the de-spread symbol posteriori probability sequences, outputting symbol priori probability sequences, working with a multi-user demodulator to perform iterative operations, judging whether a count of iterations reaches a preset threshold, and outputting decoding results if the count of the iterations reaches the preset threshold;

spreading the symbol priori probability sequences to obtain spread symbol priori probability sequences; and interleaving the spread symbol priori probability sequences to obtain interleaved symbol priori probability sequences, and sending the interleaved symbol priori probability sequences to the multi-user demodulator to undergo joint iterative operations.

6. An apparatus for receiving multi-ary error-correcting codes, comprising:

a multi-user demodulator, adapted to receive sequences and calculate the received sequences to obtain symbol posteriori probability sequences;

a de-spreading and de-interleaving unit, adapted to perform de-spreading and de-interleaving for the symbol posteriori probability sequences to obtain de-spread and de-interleaved sequences, the de-spreading and de-interleaving unit comprising:

a de-spreader, adapted to de-spread the symbol posteriori probability sequences to obtain de-spread symbol posteriori probability sequences, and a de-interleaver, adapted to de-interleave the de-spread symbol posteriori probability sequences to obtain de-interleaved symbol posteriori probability sequences;

a multi-ary decoder, adapted to decode the de-interleaved symbol posteriori probability sequences, output symbol priori probability sequences, work with the multi-user demodulator to perform iterative operations, judge whether a count of iterations reaches a preset threshold, and output decoding results if the count of the iterations reaches the preset threshold;

a spreading and interleaving unit, adapted to spread and interleave the symbol priori probability sequences, and send the spread and interleaved sequences to the multi-user demodulator to undergo joint iterative operations, the spreading and interleaving unit comprising:

a user interleaver, adapted to interleave the symbol priori probability sequences to obtain interleaved symbol priori probability sequences, and a spreader, adapted to spread the interleaved symbol priori probability sequences to obtain spread symbol priori probability sequences, and send the spread symbol priori probability sequences to the multi-user demodulator to undergo joint iterative operations;

a final de-interleaver, adapted to: receive the symbol posteriori probability sequences calculated out by the multi-user demodulator, de-interleave the symbol posteriori probability sequences to obtain a final de-interleaved symbol posteriori probability sequence, and send the final de-interleaved symbol posteriori probability sequence to the de-spreader; and a final interleaver, adapted to: receive the spread symbol priori probability sequences generated by the spreader, interleave the spread symbol priori probability sequences to obtain a final interleaved symbol priori probability sequence, and send the final interleaved symbol priori probability sequence to the multi-user demodulator.

7. A method for receiving multi-ary error-correcting codes, comprising:
  calculating received sequences to obtain symbol posteriori probability sequences;
  de-spreading the symbol posteriori probability sequences to obtain de-spread symbol posteriori probability sequences;
  de-interleaving the de-spread symbol posteriori probability sequences to obtain de-interleaved symbol posteriori probability sequences;
  decoding the de-interleaved symbol posteriori probability sequences, outputting symbol priori probability sequences, working with a multi-user demodulator to perform iterative operations, judging whether a count of iterations reaches a preset threshold, and outputting decoding results if the count of the iterations reaches the preset threshold;
  interleaving the symbol priori probability sequences to obtain interleaved symbol priori probability sequences;
  spreading the interleaved symbol priori probability sequences to obtain spread symbol priori probability sequences, and sending the spread symbol priori probability sequences to the multi-user demodulator to undergo joint iterative operations; and
    wherein after calculating the received sequences to obtain the symbol posteriori probability sequences, the method comprises:
      de-interleaving the symbol posteriori probability sequences to obtain a final de-interleaved symbol posteriori probability sequence, and
      sending the final de-interleaved symbol posteriori probability sequence to a de-spreader.

8. A method for receiving multi-ary error-correcting codes, comprising:
  calculating received sequences to obtain symbol posteriori probability sequences;
  de-spreading the symbol posteriori probability sequences to obtain de-spread symbol posteriori probability sequences;
  de-interleaving the de-spread symbol posteriori probability sequences to obtain de-interleaved symbol posteriori probability sequences;
  decoding the de-interleaved symbol posteriori probability sequences, outputting symbol priori probability sequences, working with a multi-user demodulator to perform iterative operations, judging whether a count of iterations reaches a preset threshold, and outputting decoding results if the count of the iterations reaches the preset threshold;
  interleaving the symbol priori probability sequences to obtain interleaved symbol priori probability sequences;
  spreading the interleaved symbol priori probability sequences to obtain spread symbol priori probability sequences, and sending the spread symbol priori probability sequences to the multi-user demodulator to undergo joint iterative operations; and
    wherein after decoding the de-interleaved symbol posteriori probability sequences and outputting the symbol priori probability sequences, the method comprises:
      interleaving the spread symbol priori probability sequences to obtain a final interleaved symbol priori probability sequence, and
      ending the final interleaved symbol priori probability sequence to the multi-user demodulator.

* * * * *